United States Patent
Zainuddin et al.

(10) Patent No.: US 10,991,689 B2
(45) Date of Patent: Apr. 27, 2021

(54) ADDITIONAL SPACER FOR SELF-ALIGNED CONTACT FOR ONLY HIGH VOLTAGE FINFETS

(71) Applicant: GLOBALFOUNDRIES U.S. Inc., Santa Clara, CA (US)

(72) Inventors: Abu Naser M. Zainuddin, Clifton Park, NY (US); Christopher D. Sheraw, Severn, MD (US); Sangameshwar Rao Saudari, Clifton Park, NY (US); Wei Ma, Clifton Park, NY (US); Kai Zhao, Latham, NY (US); Bala S Haran, Watervliet, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 49 days.

(21) Appl. No.: 16/376,234

(22) Filed: Apr. 5, 2019

(65) Prior Publication Data

US 2020/0321332 A1    Oct. 8, 2020

(51) Int. Cl.
| | |
|---|---|
| *H01L 27/088* | (2006.01) |
| *H01L 21/8234* | (2006.01) |
| *H01L 21/3065* | (2006.01) |
| *H01L 29/78* | (2006.01) |
| *H01L 29/66* | (2006.01) |

(52) U.S. Cl.
CPC ...... *H01L 27/0886* (2013.01); *H01L 21/3065* (2013.01); *H01L 21/823431* (2013.01); *H01L 21/823468* (2013.01); *H01L 21/823475* (2013.01); *H01L 29/6656* (2013.01); *H01L 29/66795* (2013.01); *H01L 29/785* (2013.01)

(58) Field of Classification Search
CPC .......... H01L 29/6656; H01L 29/66795; H01L 29/785; H01L 29/7831; H01L 27/0886; H01L 27/0922
See application file for complete search history.

(56) References Cited

U.S. PATENT DOCUMENTS

| | | |
|---|---|---|
| 9,972,642 B2 | 5/2018 | Hafez et al. |
| 10,106,892 B1 | 10/2018 | Siddiqui et al. |
| (Continued) | | |

FOREIGN PATENT DOCUMENTS

WO    WO-2018063366 A1 *  4/2018  .......... H01L 27/1211

*Primary Examiner* — Stephen W Smoot
*Assistant Examiner* — Sun Mi Kim King
(74) *Attorney, Agent, or Firm* — Francois Pagette; Hoffman Warnick LLC

(57) ABSTRACT

A method includes forming a first region including a pair of first FinFETs and a second region including a pair of second FinFETs on a substrate. Each FinFET includes a metal gate having a first spacer adjacent thereto, and each first FinFET has a gate dielectric that is thicker than a gate dielectric of each second FinFET, such that the first FinFETs can be higher voltage input/output devices. The method forms a first contact between the metal gates of the pair of first FinFETs with a second spacer thereabout, the second spacer contacting a portion of each first spacer. The second spacer thus has a portion extending parallel to the metal gates, and a portion extending perpendicular to the metal gates. A second contact is formed between the metal gates of the pair of second FinFETs, and the second contact devoid of the second spacer.

20 Claims, 7 Drawing Sheets

(56) References Cited

U.S. PATENT DOCUMENTS

2005/0179078 A1* 8/2005 Lee ................. H01L 21/823468
  257/314
2009/0078997 A1   3/2009 Greene et al.
2017/0033016 A1* 2/2017 Basker .............. H01L 21/76877
2017/0117296 A1* 4/2017 Chhun ............. H01L 21/02164

* cited by examiner

ADDITIONAL SPACER FOR SELF-ALIGNED CONTACT FOR ONLY HIGH VOLTAGE FINFETS

BACKGROUND

The present disclosure relates to integrated circuit (IC) fabrication, and more specifically, to a method of forming a self-aligned contact (SAC) with an additional spacer about the contact for only high voltage fin-type field effect transistors (FinFETs) on a substrate.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") are used widely because FinFETs offer better electrostatic control over the behavior in the channel than other types of FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate.

In many cases, IC fabricators establish process flows that are efficient for producing low voltage, high performance FinFETs. However, in some cases, it may be desirable to manufacture high voltage input/output FinFETs. Manufacturing devices for high voltage compared to standard voltages generally requires implementation of various modifications that may require additional processes, and present integration complexities and increased costs. For example, voltage input/output (I/O) FinFETs with their thicker gate dielectric layers present a number of challenges to meet reliability requirements relative to the self-aligned contact (SAC) processing. More particularly, electrical contacts are formed to each source/drain region of the FinFETs using SAC processing, i.e., without masks and using already present structure to direct the etching. Typically, a spacer is formed along each gate to isolate a contact formed between adjacent gates. During the conventional SAC processing, a space between gates is opened through a dielectric layer therebetween to expose the source/drain regions. The spacer protects the gates during the SAC processing, and isolates the gate from contacts in the FinFET. To continue miniaturization of devices, it is desirable to make the spacers with materials as thin as possible but with a higher dielectric constant (K) to lower the capacitance and thus improve performance. However, increasing the dielectric constant (K) value of the spacers causes lower breakdown voltage ($V_{BD}$) for high voltage I/O devices due to the increased likelihood of contact-to-gate material breakdown. The breakdown voltage ($V_{BD}$) is a voltage sufficient to cause breakdown in the material between a contact and a gate, causing shorts therebetween.

One approach to address this issue is to place a thin dielectric spacer layer in the opening for the metal gate, e.g., during a replacement metal gate (RMG) process, or forming a thicker high dielectric constant (high-K) gate dielectric layer. These approaches have a number of disadvantages such as increased complexity/difficulty in controlling a gate's width dimension and centering of the metal gate with the spacer layer in the gate opening, and significant trench isolation loss and fin height loss between the different FinFET regions during removal of the spacer layer in the gate opening.

SUMMARY

A first aspect of the disclosure is directed to a method, comprising: forming a first region including a pair of first fin-type field effect transistor (FinFET) devices and a second region including a pair of second FinFETs on a substrate, each FinFET including a metal gate having a first spacer adjacent thereto, and wherein each first FinFET has a gate dielectric that is thicker than a gate dielectric of each second FinFET; creating a first contact opening between the metal gates of the pair of first FinFETs thereby exposing the first spacers adjacent thereto and an etch stop layer over a source/drain region at a bottom of the first contact opening; depositing a dielectric spacer layer in the first contact opening between the metal gates of the pair of first FinFETs, the dielectric spacer layer covering the etch stop layer and portions of the first spacers; creating a second contact opening between the metal gates of the pair of second FinFETs, and thereby creating a second spacer from the dielectric spacer layer in the first contact opening adjacent the first spacers and exposing the source/drain region between the metal gates of the pair of first FinFETs; and forming a contact in the first and second contact opening.

A second aspect of the disclosure include a method, comprising: forming a first region including a pair of first fin-type field effect transistor (FinFET) devices and a second region including a pair of second FinFETs on a substrate, each FinFET including a metal gate having a first spacer adjacent thereto, and wherein each first FinFET has a gate dielectric that is thicker than a gate dielectric of each second FinFET; forming a first contact between the metal gates of the pair of first FinFETs with a second spacer thereabout, the second spacer contacting a portion of each first spacer; and forming a second contact between the metal gates of the pair of second FinFETs, the second contact devoid of the second spacer.

A third aspect of the disclosure related to an integrated circuit, comprising: a first region including a pair of first fin-type field effect transistor (FinFET) devices on a substrate; a second region including a pair of second FinFETs on the substrate, each FinFET including a metal gate having a first spacer extending linearly along each side of the metal gate, and wherein each first FinFET has a gate dielectric that is thicker than a gate dielectric of each second FinFET; a second spacer adjacent to a portion of each first spacer of the pair of first FinFETs only and adjacent to an interlayer dielectric between the pair of first FinFETs; a first contact extending between the metal gates of the pair of first FinFETs to a source/drain region, the first contact surrounded by the second spacer; and a second contact extending between the metal gates of the pair of second FinFETs to a source/drain region, the second contact in contact with the first spacer adjacent the metal gates of the pair of second FinFETs.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
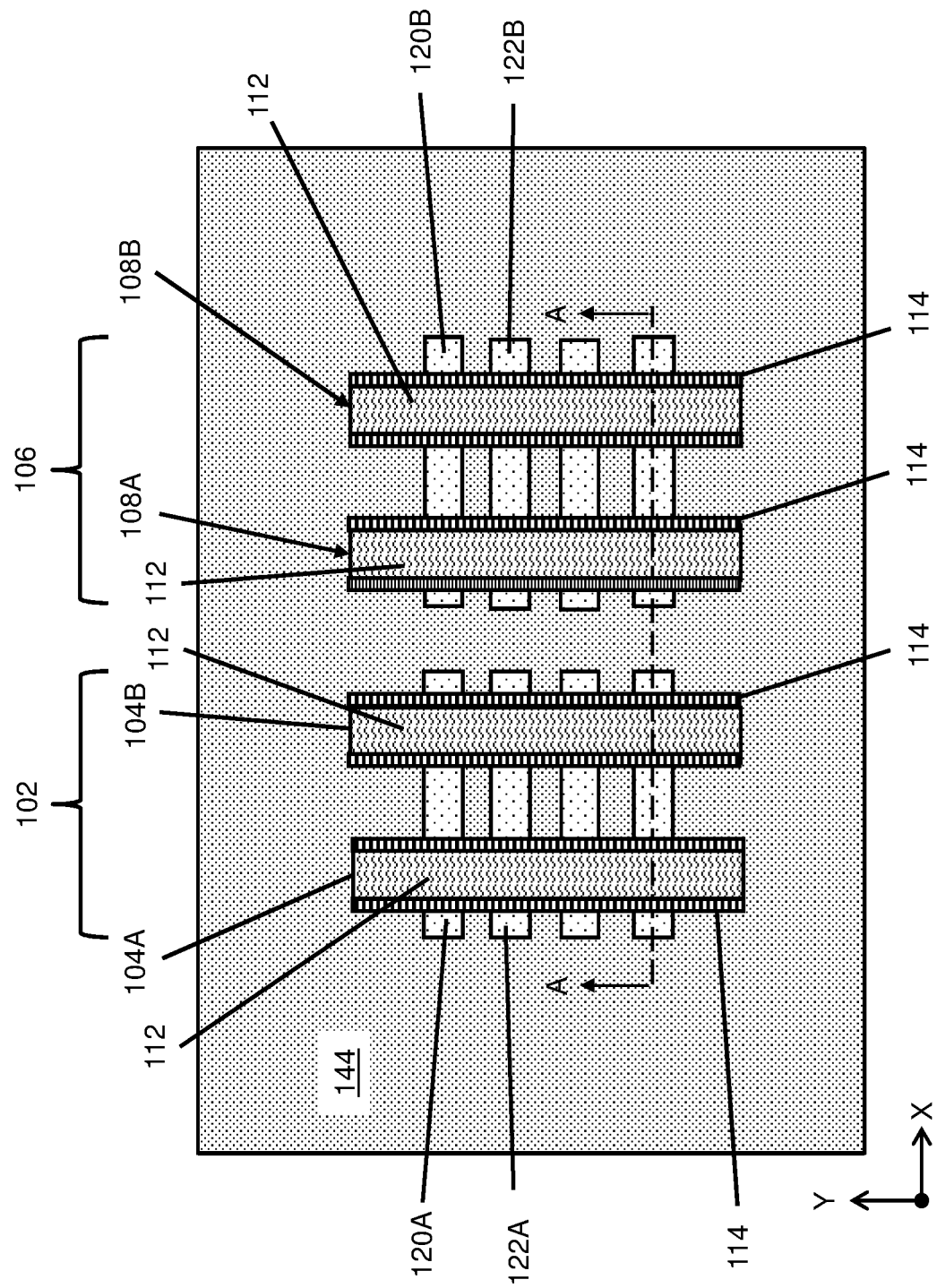
FIG. 1 shows a plan view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure include a method and an integrated circuit (IC). The method includes forming a first region including a pair of first FinFETs and a second region including a pair of second FinFETs on a substrate. Each FinFET includes a metal gate having a first spacer adjacent thereto. Further, each first FinFET has a gate dielectric that is thicker than a gate dielectric of each second FinFET, such that the first FinFETs can be higher voltage input/output (I/O) devices and the second FinFETs can be, for example, lower voltage logic devices. The method forms a first contact between the metal gates of the pair of first FinFETs with a second spacer surrounding the first contact. The second spacer also contacts a portion of each first spacer. The second spacer thus has a portion extending parallel to the metal gates, and a portion extending perpendicular to the metal gates. A second contact is formed between the metal gates of the pair of second FinFETs, but the second contact does not include the second spacer. The second spacer provides additional electrical isolation to increase breakdown voltage ($V_{BD}$) between the first contact and the metal gates, where desirable, in the high voltage I/O first FinFETs. The integration is less complex compared to other solutions, e.g., those with a spacer in the gate opening during RMG processing or an additional spacer in the contact opening formed during the source/drain epitaxy. In addition, trench isolations are not exposed to significant losses during formation of spacer on the logic devices. Since the second spacer is formed in the contact opening, gate centering issues are eliminated.

Figure 2:
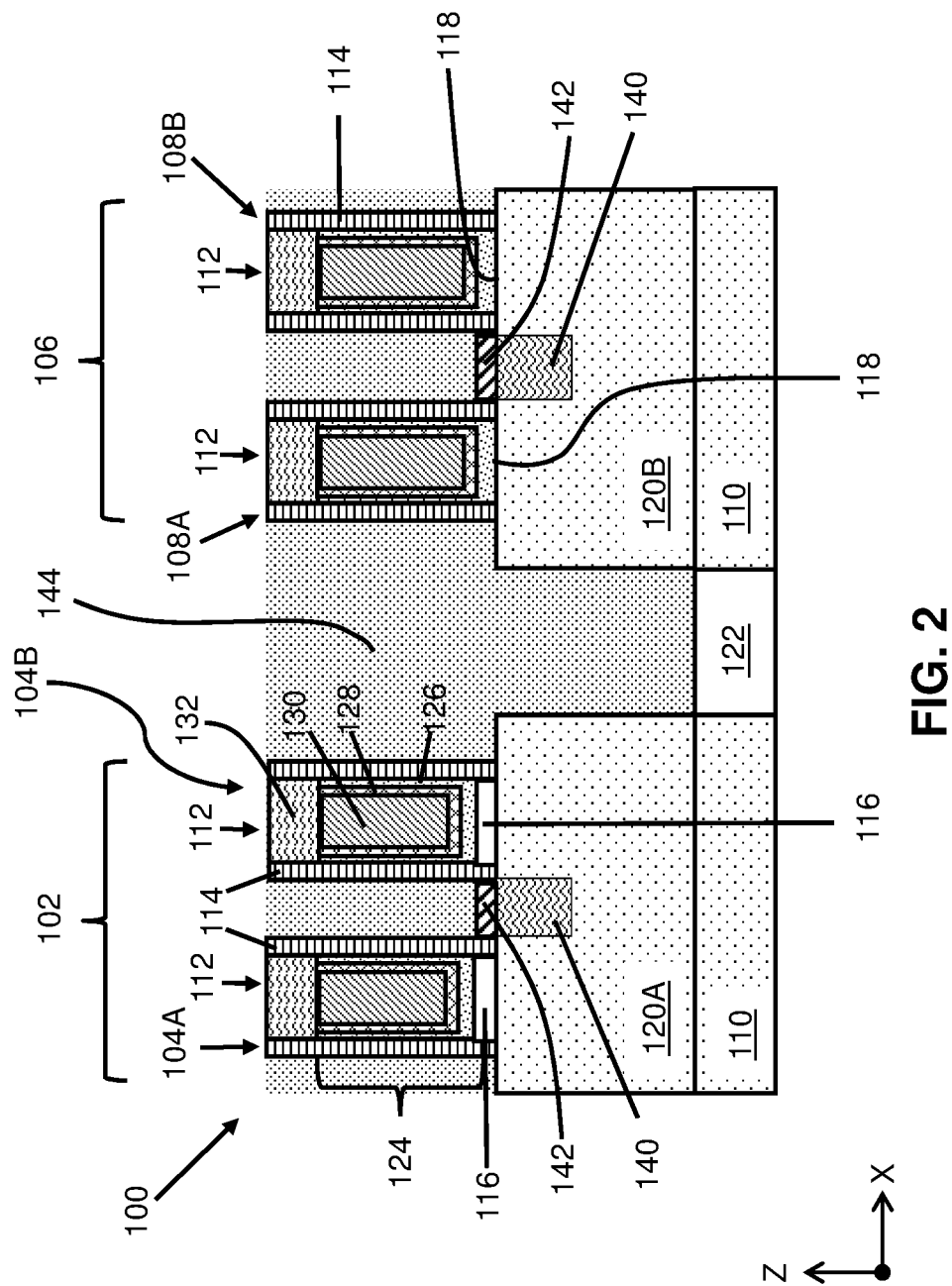
FIG. 2 shows a cross-sectional view, along line A-A of FIG. 1, of the initial structure according to embodiments of the disclosure.

FIGS. 1 and 2 show a structure 100 after a first process of the method according to embodiments of the disclosure.

FIG. 1 shows a plan view and FIG. 2 (and subsequent drawings except FIG. 7) shows a cross-sectional view through line A-A in FIG. 1. The process shown may include forming a first region 102 including a pair of first fin-type field effect transistors (FinFETs) 104A, B and a second region 106 including a pair of second FinFETs 108A, B on a substrate 110. As will be further described, each FinFET 104A, B and 108A, B includes a metal gate 112 having a first spacer 114 (FIG. 2 only) adjacent thereto.

More particularly, structure 100 can include a set (i.e., one or more) of semiconductor regions 102, 106 from which multiple transistor structures 104A, B and 108A, B may be formed. Semiconductor regions 102, 106 can be formed in a variety of ways from an initial substrate 110. Various embodiments may include regions of semiconductor material in the form of semiconductor fins (simply "fins" hereafter) 120A, 120B extending in parallel with each other. Throughout the disclosure, fins 120A, 120B may be referred to collectively simply as fins 120. FIG. 1 provides an example including four fins 120, but structure 100 may include any desired number of fins 120. Structure 100 may also include a set of metal gates 112 each extending transversely over fins 120. Although fin(s) 120 are provided as an illustrated example, embodiments of the disclosure may be formed on any type of semiconductor region (e.g., bulk semiconductor material) without significant modifications.

A shallow trench isolation (STI) 122 of structure 100, may be positioned underneath and/or adjacent to fin(s) 120 and metal gate(s) 112. STI(s) 122 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Referring to FIG. 2, fins 120 and metal gates 112 of structure 100 are shown in further detail. Each fin 120 may be formed from an underlying semiconductor substrate 110, e.g., by removing targeted portions of substrate 110 to a predetermined depth, causing the non-removed portions to form fins 120 directly on substrate 110. Substrate 110 may include, e.g., one or more currently-known or later developed semiconductor substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}S_{B1}Te_{B2}$, where A1, A2, B1, and B2 are relative proportions each greater than or equal to zero and A1+A2+B1+B2=1 (1 being a total mole quantity). First and second fin(s) 120A, 120B may appear in locations different from those in the accompanying drawings, e.g., portions of substrate 110 which are not in a single plane or substantially horizontally aligned. In still further examples, fins 120A, 120B may be initially formed as a single fin and subsequently separated into two or more distinct fins by forming a single diffusion break (SDB) to subdivide one fin into multiple fins.

In FIG. 2, each metal gate 112 is shown as fully formed. Embodiments of the disclosure may be implemented without regard to whether a gate region 124 is formed using a gate first or replacement metal gate (RMG) processing paradigm. Metal gates 112 may cover one or more semiconductor fins 120 positioned above substrate 110, e.g., by coating exposed portions and an upper surface of fin(s) 120. Metal gates 112 may include multiple subcomponents. Each metal gate 112 may include a gate dielectric 116, 118. As shown best in FIG. 2, each first FinFET 104A, B has a gate dielectric 116 that is thicker than a gate dielectric 118 of each second FinFET 108A, B. The different thickness of gate dielectric 116, 118 allows use of first FinFETs 104A, B as high voltage I/O devices, and second FinFETs 108A, 108B as other forms of, for example, lower voltage logic devices. The different FinFETs are separated into the different regions 102, 106 by STI 122. Gate dielectric 116 may have an illustrative thickness of 34-36 Angstroms (Å), while gate dielectric 118 may have a thickness of approximately 7-8 Å. As understood in the field, the actual voltage levels and the actual gate dielectric thicknesses may vary depending on the technology node in which employed, e.g., 22 nanometer (nm), 14 nm, 7 nm, etc.

Metal gates 112 may also include a gate region 124 (labeled for FinFET 104A in FIG. 2 only for clarity) formed on gate dielectric 116. Gate regions 124 may include one or more conductive components for providing a gate terminal of a transistor. Metal gates 112 may include a high dielectric constant (high-K) layer 126, a work function metal layer 128 and a gate conductor 130. High-K layer 126 may include any now known or later developed high-K material typically used for metal gates 112 such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Work function metal layer 128 may include varying metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Gate conductor 130 may include any now known or later developed gate conductor such as copper (Cu).

Metal gates 112 also may include a gate cap 132 over gate region 124. Gate cap 132 may include one or more insulative materials configured to protect underling portions of gate region 124 from being removed, modified, implanted, etc., as other portions of a structure are formed. For instance, gate cap 132 may include silicon nitride (SiN) and/or other insulative materials noted herein.

First spacers 114 may be formed adjacent to gate dielectric film 116, 118 and gate region 124. First spacer(s) 114 may be provided as one or more bodies of insulating material formed on exposed portions of STI(s) 122 and/or metal gate(s) 112, e.g., by deposition/etching, thermal growth, etc. First spacer(s) 114 may be formed on or adjacent to metal gate(s) 112 to electrically and physically separate metal gate(s) 112 from other components of structure 100. First spacer(s) 114 may include one or more low dielectric constant (low-K) dielectric materials, i.e., dielectric materials with a dielectric constant of at most approximately 3.9. First spacer 114 for example, may include one or more insulative oxide and/or nitride materials. In some cases, first spacer(s) 114 may include one or more insulative materials included in STI(s) 122 or a different insulative material.

Structure 100 also includes source/drain regions 140 in fins 120A, 120B. Source/drain regions 140 may be formed using any now known or later developed technique, e.g., implantation of dopant into fins 120A, 120B and epitaxial growth. An etch stop layer 142 is shown over source/drain regions 140 between first spacers 114 of adjacent metal gates 112. An inter-level dielectric (ILD) 144 is also shown about metal gates 112. Suitable dielectric materials for ILD 144 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-K films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-K (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one embodiment, ILD 144 includes an oxide.

While FIGS. 1 and 2 provides one preliminary set of materials targeted for use with embodiments of the disclosure, it is understood that embodiments of the disclosure may be implemented on different designs without significant changes to the various example techniques discussed herein. While structure 100 has been described herein as being formed in one illustrative manner, it is emphasized that structure 100 may have large number of alternative techniques to form it, all of which are considered within the scope of the disclosure.

FIGS. 3-6 show processes for forming a first contact 180 (FIG. 6) between metal gates 112 of pair of first FinFETs 104A, 104B with a second spacer 172 (FIG. 6) thereabout, and forming a second contact 182 (FIG. 6) between metal gates 112 of pair of second FinFETs 108A, 108B. As will be described in greater detail, second spacer 172 contacts a portion of each first spacer 114, and second contact 182 is devoid of the second spacer.

Figure 3:
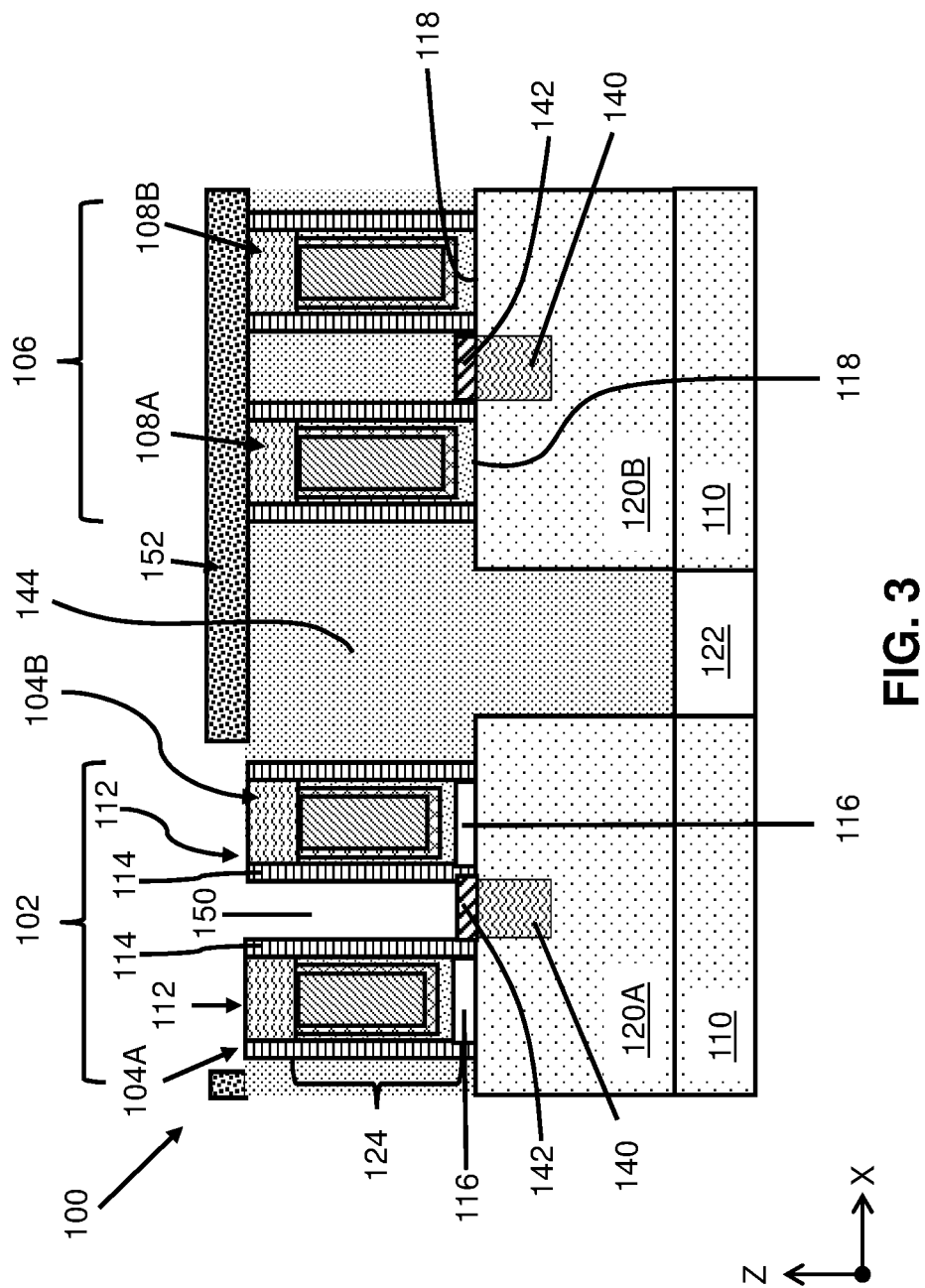
FIG. 3 shows a cross-sectional view of forming a first contact opening according to embodiments of the disclosure.

FIG. 3 shows a cross-sectional view of creating a first contact opening 150 between metal gates 112 of pair of first FinFETs 104A, 104B thereby exposing first spacers 114 adjacent thereto and etch stop layer 142 over source/drain region 140 at a bottom of first contact opening 150. A mask 152 may be provided to protect region 106 and pair of second FinFETs 108A, 108B. First contact opening 150 may be formed by etching. Etching generally refers to the removal of material from a substrate (or structures formed on the substrate), and is often performed with a mask, e.g., mask 152, in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In one embodiment, first contact opening 150 formation may include a RIE.

Figure 4:
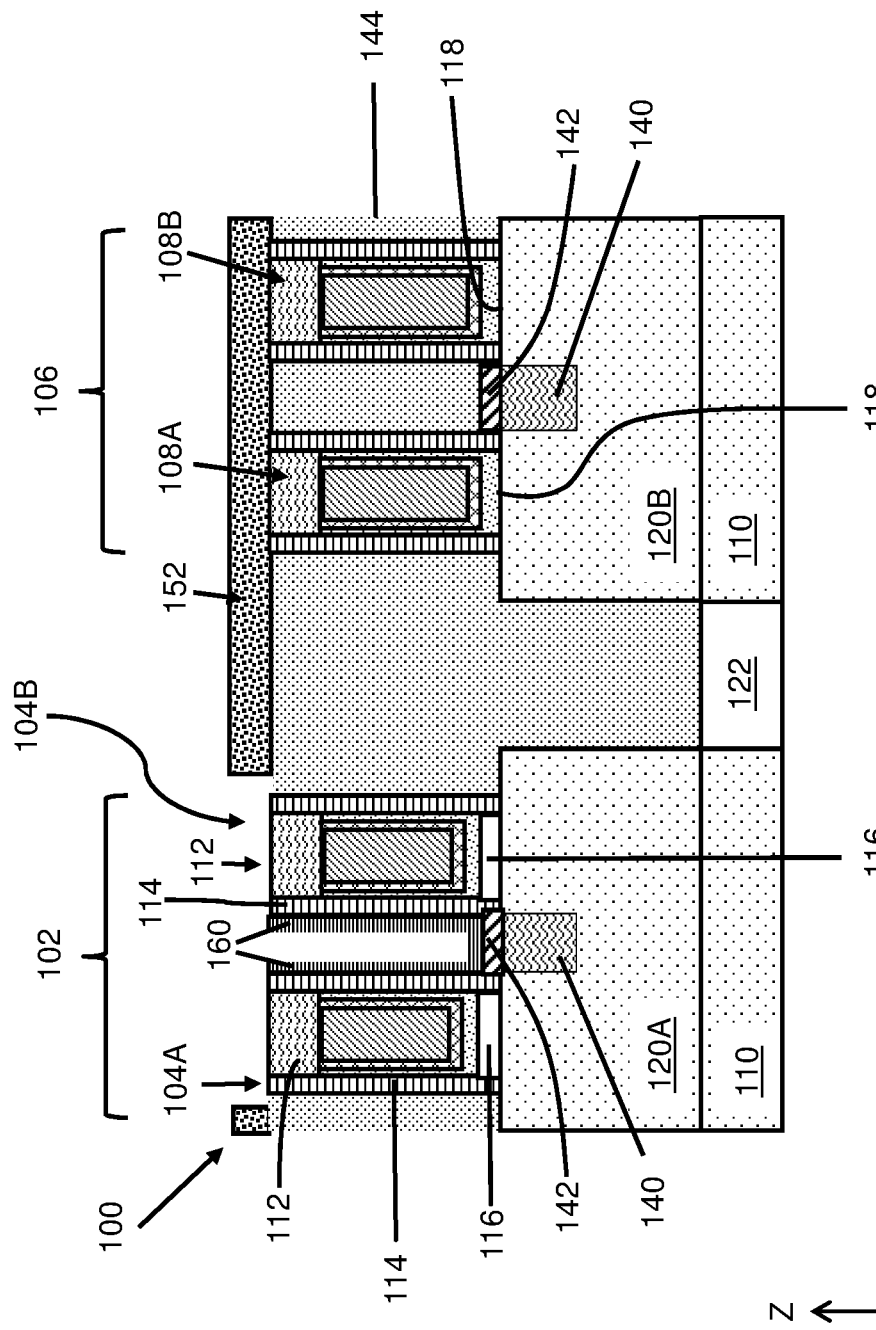
FIG. 4 shows a cross-sectional view of forming a dielectric spacer layer according to embodiments of the disclosure.

FIG. 4 shows a cross-sectional view of depositing a dielectric spacer layer 160 in first contact opening 150 (FIG. 3) between metal gates 112 of pair of first FinFETs 104A, 104B. As shown, dielectric spacer layer 160 covers etch stop layer 142 and portions of first spacers 114. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In one embodiment, dielectric spacer layer 160 may include any low temperature ALD dielectric material such as silicon oxy-carbide (SiOC), or silicon oxy-carbonitride (SiOCN). Dielectric spacer layer 160 may have a dielectric constant of less than 4.0. Any excess dielectric spacer layer 160 may be removed by planarization. Planarization refers to various processes that make a surface more planar (that is, more flat and/or smooth). Chemical-mechanical-polishing (CMP) is one currently conventional planarization process which planarizes surfaces with a combination of chemical reactions and mechanical forces.

Figure 5:
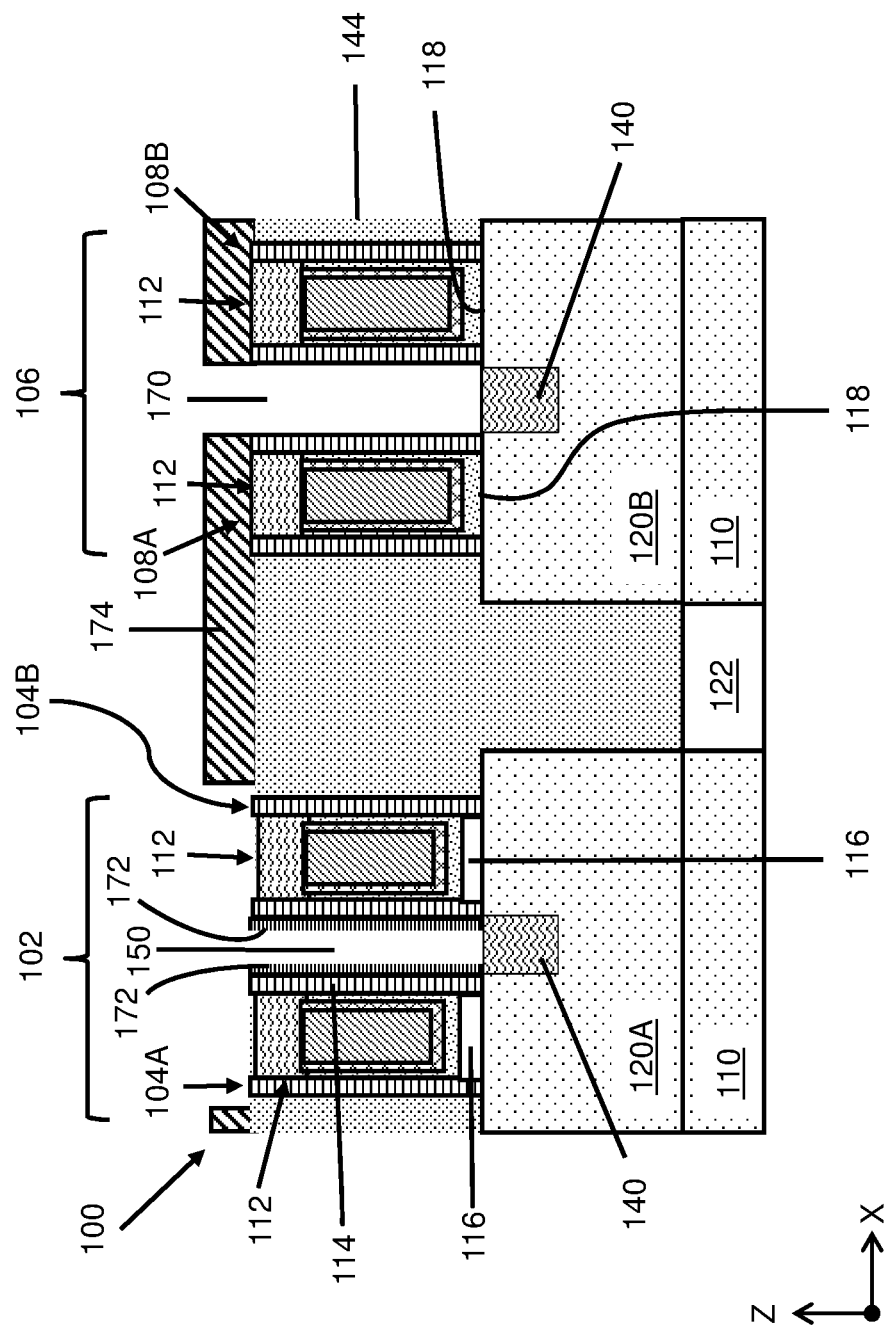
FIG. 5 shows a cross-sectional view of forming a second contact opening and additional spacer in the first contact opening according to embodiments of the disclosure.

FIG. 5 shows a cross-sectional view of creating a second contact opening 170 between metal gates 112 of pair of second FinFETs 108A, 108B. As illustrated, this process includes an etch that creates a second spacer 172 from dielectric spacer layer 160 (FIG. 4) in first contact opening 150 (FIG. 3) adjacent first spacers 114 and exposes source/drain region 140 between metal gates of pair of first FinFETs 104A, 104B. A patterned mask 174 may be used during this process to create second contact opening 170 and keep first contact opening 150 exposed. In one embodiment, this process may include performing a first etch, e.g., a RIE, to create second contact opening 170 between metal gates 112 of pair of second FinFETs 108A, 108B, i.e., to remove ILD 144 therebetween. Further, the process may include a second etch, e.g., a wet etch, to remove etch stop layer 142 over source/drain region 140 between metal gates 112 of pair of first FinFETs 104A, 104B. This latter etch also creates a second spacer 172, e.g., by removing dielectric spacer layer 160 from a bottom of first contact opening 150. Since second spacer 172 is formed from dielectric spacer layer 160 (FIG. 4), it may have a dielectric constant of less than 4.0, and may include, for example, SiOC or SiOCN. The second etch also removes etch stop layer 142 over source/drain 140 between metal gates 112 of pair of second FinFETs 108A, 108B. While particular illustrative etch formats have been stated, it is understood that the etching can include any now known or later developed etching chemistry appropriate for the materials to be removed.

Figure 6:
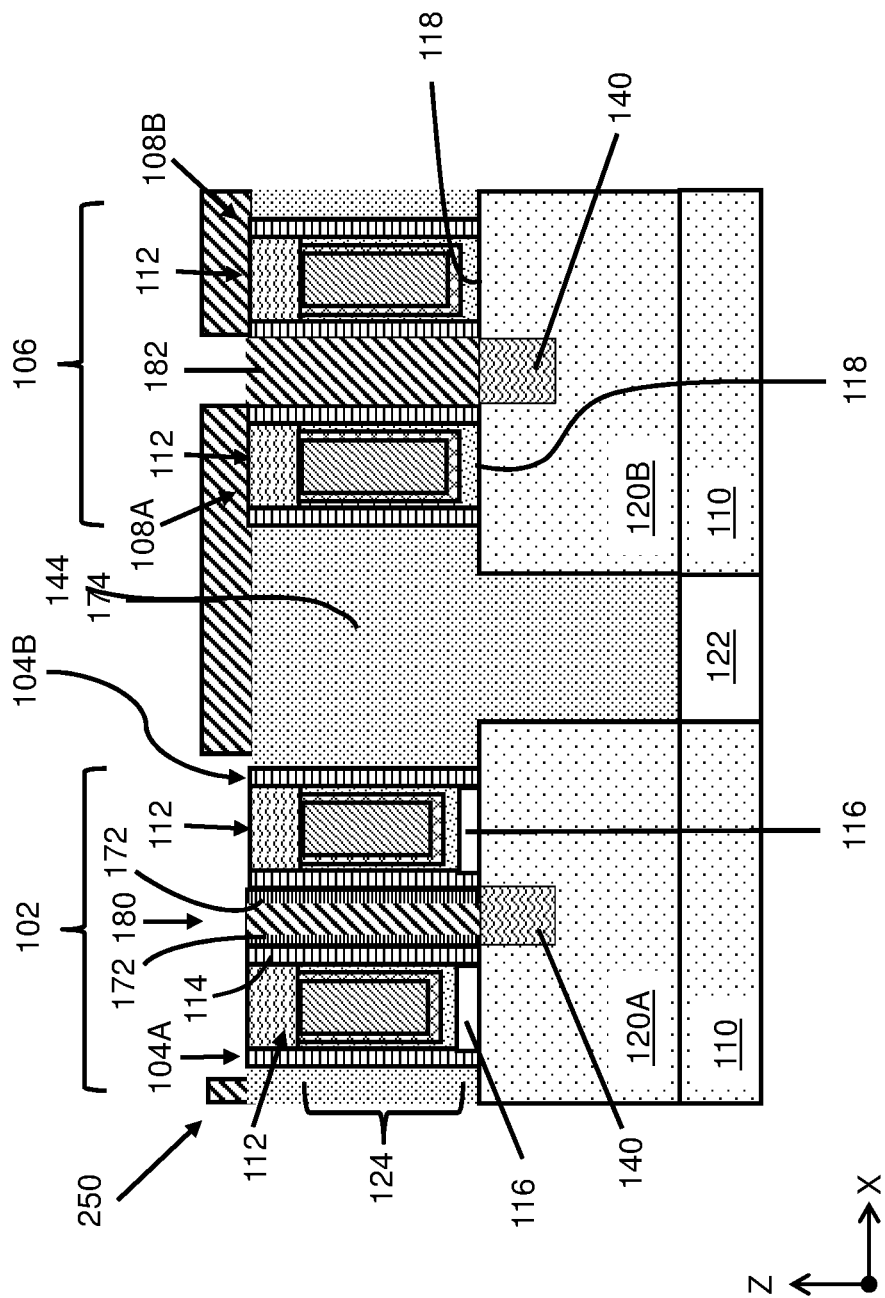
FIG. 6 shows a cross-sectional view of forming a first and second contact according to embodiments of the disclosure, and an integrated circuit according to embodiments of the disclosure.

FIG. 6 shows a cross-sectional view of forming a contact in first and second contact openings 150, 170 (FIG. 5). A first contact 180 is formed in first contact opening 150 (FIG. 5) and a second contact 182 is formed in second contact opening 170 (FIG. 5). Contacts 180, 182 may be formed using any now known or later developed contact forming procedure. In one embodiment, each contact 180, 182 may be formed by depositing a conductor in openings 150, 170 (FIG. 5) and planarizing excess conductor thereafter. The conductor may include a layer of refractory metal liner (not shown separately) such as ruthenium, tantalum (Ta), titanium (Ti), tungsten (W), iridium (Ir), rhodium (Rh) and platinum (Pt), etc., or mixtures of thereof, and then a contact conductor such as tungsten (W).

Figure 7:
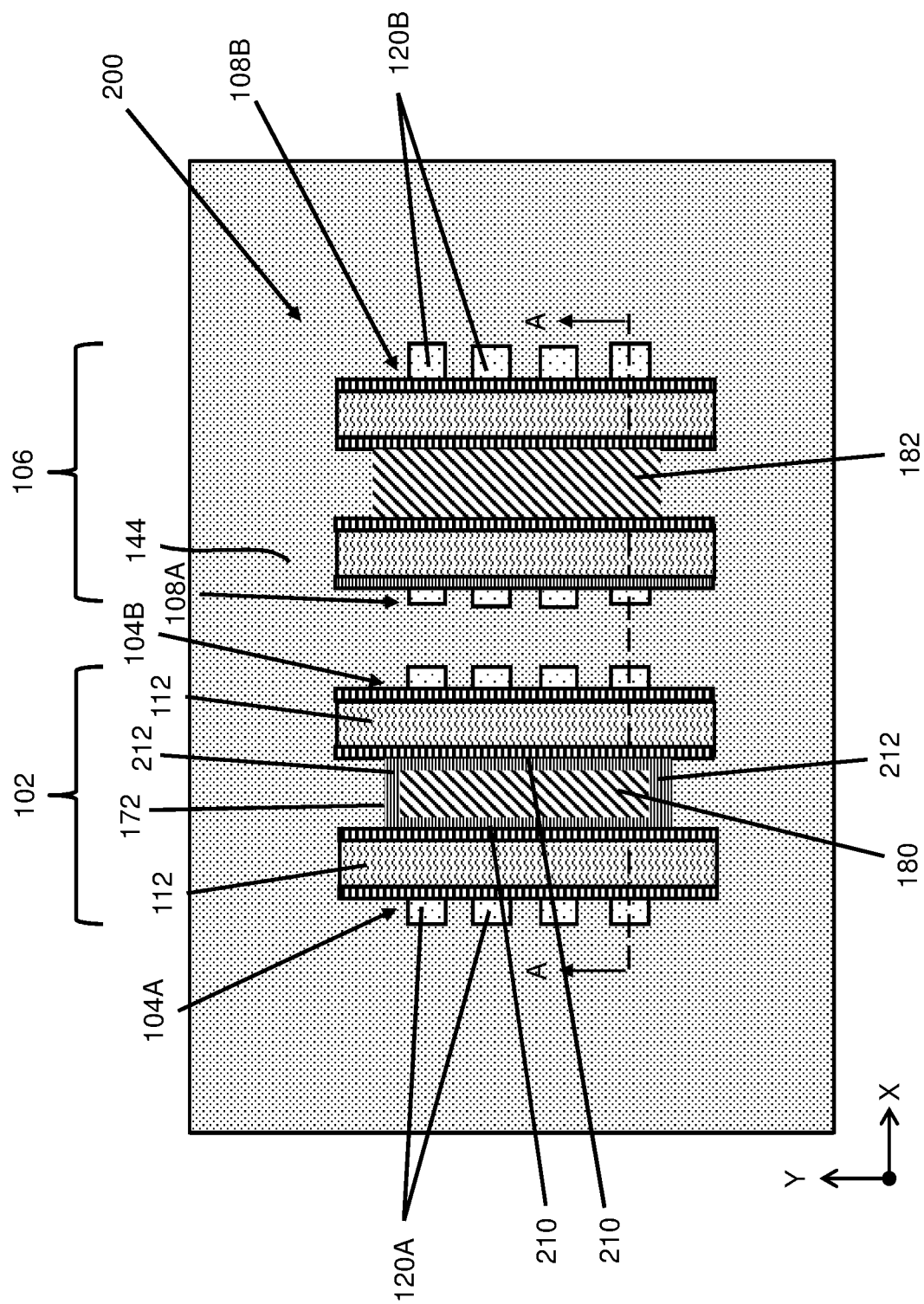
FIG. 7 shows a plan view of an integrated circuit according to embodiments of the disclosure.

As shown in FIG. 6 and the plan view of FIG. 7, second spacer 172 provides additional distance between first contact 180 and pair of first FinFETs 104A, 104B, the latter of which will be used as high voltage I/O devices. In contrast, second spacer 172 is not present between pair of second FinFETs 108A, 108B, which will be used, for example, as lower voltage logic devices. Consequently, each first FinFET 104A, 104B has a higher breakdown voltage $V_{BD}$ than each second FinFET 108A, 108B.

FIGS. 6 and 7 also show an IC 200 according to embodiments of the disclosure. IC 200 includes first region 102 including pair of first FinFETs 104A, 104B on substrate 110, and a second region 106 including a pair of second FinFETs 108A, 108B on substrate 110. Each FinFET 104A, B and 108A, B includes metal gate 112 having first spacer 114 extending linearly along each metal gate, see FIG. 7. That is, each first spacer 114 is linear and extends along a respective metal gate 112. As shown in FIG. 6, each first FinFET 104A, 104B has gate dielectric 116 that is thicker than gate dielectric 118 of each second FinFET 108A, 108B, allowing first FinFETs 104A, 104B to act as high voltage I/O devices.

IC 200 also includes second spacer 172 adjacent to a portion of each first spacer 114 of pair of first FinFETs 104A, 104B only. As shown best in FIG. 7, second spacer 172 is also adjacent to ILD 144 between pair of first FinFETs 104A, 104B.

IC 200 also includes first contact 180 extending between metal gates 112 of pair of first FinFETs 104A, 104B to source/drain region 140. IC 200 also includes second contact 182 extending between metal gates 112 of pair of second FinFETs 108A, 108B to source/drain region 140. Second contact 182 is in contact with first spacer 114 adjacent metal gates 112 of pair of second FinFETs 108A, 108B, but also is in contact with ILD 144. As shown in FIG. 7, in contrast to first spacer 114, second spacer 172 surrounds a respective first contact 180. That is, first contact 180 is completely surrounded by second spacer 172, so it does not contact ILD 144 or first spacer 114. Each second spacer 172 includes at least one portion 210 extending linearly along a portion of respective first spacers 114 and at least one portion 212 extending perpendicularly between adjacent first spacers 114. Here, portion(s) 210 extend parallel to metal gates 112 and perpendicular to fins 120A, while portion(s) 212 extend perpendicular to metal gates 112 and parallel to fins 120A. Second spacer 172 may include, for example, silicon oxycarbide (SiOC) or silicon oxy-carbonitride (SiOCN).

Embodiments of the disclosure provide a method and resulting IC 200 that includes second spacer 172 that selectively provides additional electrical isolation to increase breakdown voltage ($V_{BD}$) between first contact 180 and metal gates 112 for high voltage I/O first FinFETs 104A, 104B only. Each first FinFET 104A, 104B has a higher breakdown voltage $V_{BD}$ than each second FinFET 108A, 108B. The integration of second spacer 172 according to embodiments of the disclosure is less complex compared to other solutions. For example, trench isolations 122 are not exposed to significant losses during formation of spacer 172 on logic FinFETs 108A, 108B as in other approaches. Since second spacer 172 is formed in contact opening 150 (FIG. 5), metal gate 112 centering issues that exist during approaches that form additional spacers in the gate opening are eliminated. Second spacer 172 is also formed after source/drain region 140, thus eliminating fin height variability and/or spacer erosion on logic FinFETs 108A, 108B that exist with other approaches.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit, comprising:
a first region including a pair of first fin-type field effect transistors (FinFETs) on a substrate;
a second region including a pair of second FinFETs on the substrate, each of the first FinFETs and the second FinFETs including a metal gate having a first spacer extending linearly along each side of the metal gate, and wherein each first FinFET has a gate dielectric that is thicker than a gate dielectric of each second FinFET;
a second spacer adjacent to a portion of each first spacer of the pair of first FinFETs and adjacent to an interlayer dielectric between the pair of first FinFETs;
a first contact extending between the metal gates of the pair of first FinFETs to a first source/drain region, the first contact completely surrounded by the second spacer such that the first contact is free of contact with the interlayer dielectric; and
a second contact extending between the metal gates of the pair of second FinFETs to a second source/drain region, the second contact in contact with the first spacer adjacent the metal gates of the pair of second FinFETs.

2. The IC of claim 1, wherein each first FinFET has a higher breakdown voltage than each second FinFET.

3. The IC of claim 1, wherein each first spacer is linear and extends along a respective metal gate, and wherein each second spacer includes portions extending linearly along a portion of respective first spacers and portions extending perpendicularly between adjacent first spacers.

4. The IC of claim 3, wherein each second spacer surrounds a respective first contact.

5. The IC of claim 1, wherein the second spacer has a dielectric constant of less than 4.0.

6. The IC of claim 1, wherein the second spacer includes silicon oxy-carbide (SiOC) or silicon oxy-carbonitride (SiOCN).

7. The IC of claim 1, wherein the second spacer has at least one first portion extending parallel to the metal gates, and at least one second portion extending perpendicular to the metal gates.

8. The IC of claim 3, wherein the portions of each second spacer extending linearly along the portion of respective first spacers of the pair of first FinFETs are adjacent to and in contact with the portion of respective first spacers and the first contact, and the portions of each second spacer extending perpendicularly between adjacent first spacers of the pair of first FinFETs are adjacent to and in contact with the interlayer dielectric and the first contact.

9. The IC of claim 1, wherein the first contact is free of contact with the interlayer dielectric and the first spacer of the pair of first FinFETs.

10. The IC of claim 1, wherein the second contact is adjacent to and in contact with the interlayer dielectric and the first spacer of the pair of second FinFETs.

11. An integrated circuit, comprising:
a first region including a pair of first fin-type field effect transistors (FinFETs) on a substrate;
a second region including a pair of second FinFETs on the substrate, each FinFET including a metal gate having a first spacer extending linearly along each side of the metal gate, and wherein each first FinFET has a gate dielectric that is thicker than a gate dielectric of each second FinFET;
a second spacer adjacent to a portion of each first spacer of the pair of first FinFETs, wherein the second spacer is adjacent to and in contact with an interlayer dielectric between the pair of first FinFETs;
a first contact extending between the metal gates of the pair of first FinFETs to a first source/drain region, the first contact surrounded by the second spacer; and
a second contact extending between the metal gates of the pair of second FinFETs to a second source/drain region, the second contact in contact with the first spacer adjacent the metal gates of the pair of second FinFETs.

12. The IC of claim 11, wherein each first FinFET has a higher breakdown voltage than each second FinFET.

13. The IC of claim 11, wherein each first spacer is linear and extends along a respective metal gate, and wherein each second spacer includes portions extending linearly along a portion of respective first spacers and portions extending perpendicularly between adjacent first spacers.

14. The IC of claim 13, wherein the portions of each second spacer extending linearly along the portion of respective first spacers of the pair of first FinFETs are adjacent to and in contact with the portion of respective first spacers and the first contact, and the portions of each second spacer extending perpendicularly between adjacent first spacers of the pair of first FinFETs are adjacent to and in contact with the interlayer dielectric and the first contact.

15. The IC of claim 11, wherein each second spacer surrounds a respective first contact.

16. The IC of claim 11, wherein the second spacer has a dielectric constant of less than 4.0.

17. The IC of claim 11, wherein the second spacer includes silicon oxy-carbide (SiOC) or silicon oxy-carbonitride (SiOCN).

18. The IC of claim 11, wherein the second spacer has at least one first portion extending parallel to the metal gates, and at least one second portion extending perpendicular to the metal gates.

19. The IC of claim 11, wherein the first contact is free of contact with the interlayer dielectric and the first spacer of the pair of first FinFETs.

20. The IC of claim 11, wherein the second contact is adjacent to and in contact with the interlayer dielectric and the first spacer of the pair of second FinFETs.

* * * * *